United States Patent [19]

Takeuchi et al.

[11] Patent Number: 5,168,462
[45] Date of Patent: Dec. 1, 1992

[54] SENSE AMPLIFIER HAVING REDUCED COUPLING NOISE

[75] Inventors: Yoshiaki Takeuchi, Yokohama; Masaru Koyanagi, Tokyo, both of Japan

[73] Assignee: Kabushiki Kaisha Toshiba, Kawasaki, Japan

[21] Appl. No.: 585,703

[22] Filed: Sep. 20, 1990

[30] Foreign Application Priority Data

Sep. 21, 1989 [JP] Japan .................................. 1-245566

[51] Int. Cl.[5] .......................... G11C 7/00; H01L 27/00
[52] U.S. Cl. ........................................ 365/51; 365/63; 365/206
[58] Field of Search .................. 365/51, 63, 206, 214, 365/149

[56] References Cited

U.S. PATENT DOCUMENTS 3,942,164  3/1976  Dunn .................................. 365/214

FOREIGN PATENT DOCUMENTS 0197639  10/1986  European Pat. Off. .

OTHER PUBLICATIONS

M. Aoki et al., IEEE Journal of Solid-State Circuits, "A 60-ns 16 Mbit CMOS Dram with a ... ", vol. 23, No. 5, Oct. 1988, pp. 1113–1119.

Primary Examiner—Joseph A. Popek
Attorney, Agent, or Firm—Foley & Lardner

[57] ABSTRACT

In a semiconductor memory device having plural pairs of bit lines and plural sense amplifiers, a gate electrode of a sense amplifier transistor for sensing potential of a first side of a first bit line pair is formed with an extension portion extending under and along the first side of a second bit line pair. A capacitance $C_B$ formed between the extension of the gate electrode and the first side of the second bit line pair is determined to be equal or larger than capacitance $C_A$ formed between the first side of the first bit line pair and the gate electrode. Since the potential of the first side of the bit line pair fluctuates roughly in phase with that of the second side of the same bit line pair, a harmful influence due to interference noise can be reduced, without increasing the chip layout area, by only modifying the shapes of the gate electrodes of the sense amplifier transistors.

4 Claims, 2 Drawing Sheets

SENSE AMPLIFIER HAVING REDUCED COUPLING NOISE

BACKGROUND OF THE INVENTION

The present invention relates to a semiconductor memory device provided with sense amplifiers.

FIG. 2 shows a core portion of a DRAM (dynamic random access memory) as an example of the semiconductor memory device provided with sense amplifiers. A pair of bit lines BLi and $\overline{BLi}$ are connected to one of the sense amplifiers SAi (i=0, 1, 2 ... ), respectively. Coupling capacitances between two of these two adjacent bit lines can be represented, for example, by Co between a pair of two bit lines BL1 and $\overline{BL1}$, $C_1$ between two adjacent bit lines BL1 and $\overline{BL0}$, and $C_2$ between two adjacent bit lines BL2 and $\overline{BL1}$.

Further, FIG. 3 shows transistors which constitute sense amplifiers, respectively, in which each electrode 1, 2, 3 or 4 of each transistor is formed under and along each bit line $\overline{BL0}$, BL1, $\overline{BL1}$ or BL2 and connected to the bit line at each contact portion 5, 6, 7 or 8, thereof, respectively.

In the prior-art semiconductor memory device provided with sense amplifiers described above, however, since the distance between two adjacent bit lines (e.g. BL1 and $\overline{BL0}$) is shorter than a distance between a pair of bit lines (e.g. BL1 and BL1) in general, there exists a problem in that interference noise is easily generated via each coupling capacitance. In addition, since the pitch distance between the two adjacent bit lines is increasingly shorten with the increasing integration rate of integrated circuits, the larger the coupling capacitances between the two adjacent bit lines, the more the interference noise.

However, when the potential between two adjacent bit lines fluctuates due to noise, since the potential between a pair of bit lines also fluctuates due to the interference noise via the coupling capacitances, the data-read potential generated when data are read out of each memory call via a pair of the bit lines also fluctuates, thus resulting in a problem in that erroneous data may be amplified when the data-read potential is amplified by the sense amplifier.

In practice, an assumption is made that high level data is read through the bit line $\overline{BL1}$ and the potential of the bit line BL1 is at $\frac{1}{2}$ $V_{cc}$ and that of $\overline{BL1}$ is at a level a little lower than $\frac{1}{2}$ $V_{cc}$, where $V_{cc}$ denotes the supply voltage. Under these conditions, if the potential of the adjacent bit line $\overline{BL0}$ fluctuates downward to the ground potential ($V_{ss}$) due to noise, since the potential of the bit line BL1 drops below the potential of the bit line $\overline{BL1}$ according to the noise level, so that an erroneous data is read out of the memory in case the data is amplified by the sense amplifier under those abnormal conditions. In this case, if the same level noise is superposed upon another adjacent bit line BL2 simultaneously, since the difference in potential between a pair of the bit lines BL1 and $\overline{BL1}$ does not change, the above-mentioned erroneous operation can be prevented. However, if noise is superposed upon only one of the two adjacent bit lines $\overline{BL0}$ and BL2 into unbalanced conditions, erroneous operation is liable to occur.

To overcome the problem caused by the abovementioned interference noise between two bit lines, there has been proposed a method of canceling two in-phase noises superposed upon the two adjacent bit lines by crossing a pair of bit lines as shown in FIG. 4. In this prior-art method, however, since the two bit lines are crossed, there arises another problems in that the chip area increases and therefore the device's core forming process is complicated.

SUMMARY OF THE INVENTION

With these problems in mind, therefore, it is the object of the present invention to provide a semiconductor memory device which can minimize interference noise due to capacitance coupling between two bit lines without increasing the chip layout area.

To achieve the above-mentioned object, in the semiconductor memory device according to the present invention, a gate electrode ($\overline{G}_1$) of a transistor constituting a sense amplifier to sense a potential of a first side ($\overline{BL1}$) of a first pair of bit lines is formed with an extension portion (14) extending under and along a corresponding first side ($\overline{BL0}$) of a second adjacent pair of bit lines; and a capacitance $C_B$ formed between the extension portion (14) and the corresponding first side ($\overline{BL0}$) of the second pair of bit lines is determined to be equal or larger than that $C_A$ formed between the first side ($\overline{BL1}$) of the first pair of bit lines and the gate electrode ($\overline{G}_1$).

According to the present invention, since the potential of the bit line $\overline{BL1}$ fluctuates roughly in phase with that of the bit line BL1, it is possible to reduce the interference noise due to capacitance coupling between the two bit lines, significantly, without increasing the chip layout area, by only modifying the shapes of the gate electrodes of the sense amplifier transistors.

BRIEF DESCRIPTION ON THE DRAWINGS

DETAILED DESCRIPTION ON THE PREFERRED EMBODIMENTS

Figure 1:
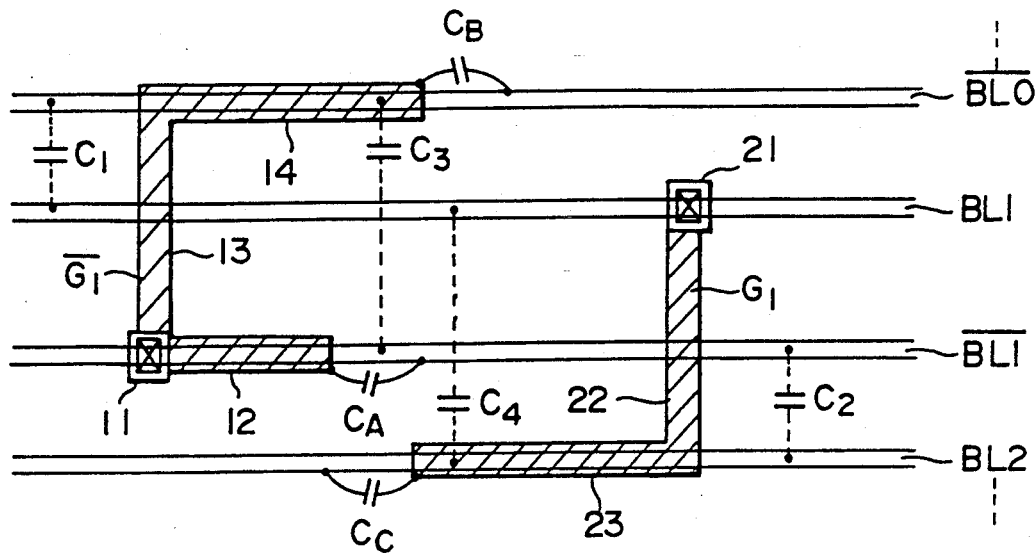
FIG. 1 is a bit line arrangement diagram showing an embodiment of the semiconductor memory device according to the present invention.
Figure 2:
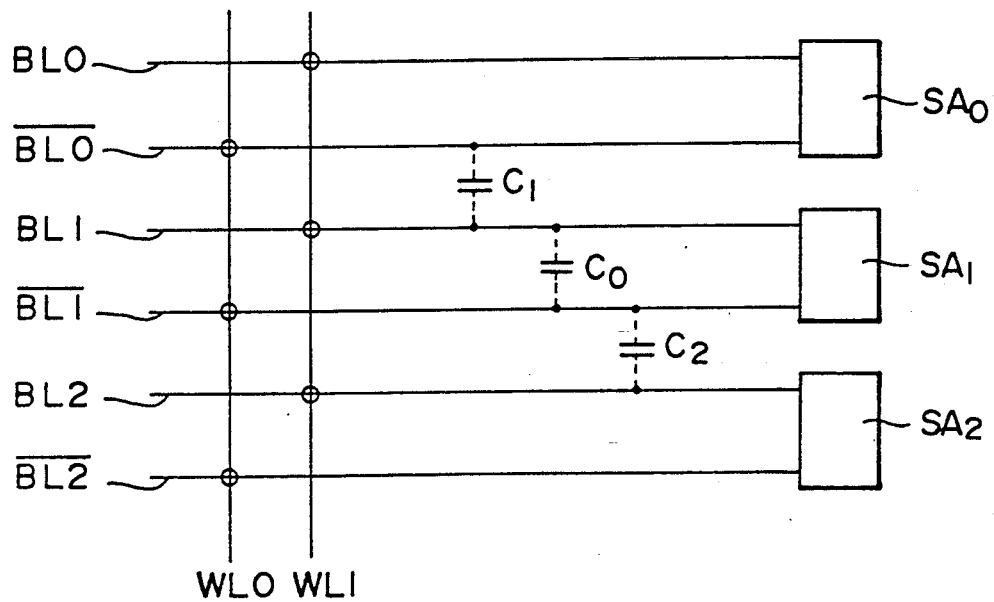
FIG. 2 is a prior-art bit line arrangement diagram for assistance in explaining sense amplifier configuration.
Figure 3:
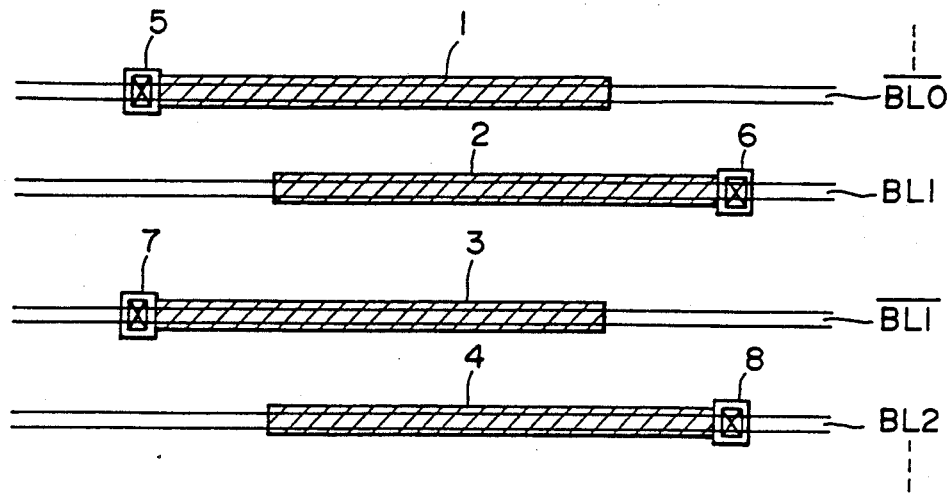
FIG. 3 is a prior-art bit line arrangement for showing transistor gate electrodes of the memory device.

FIG. 1 shows an embodiment of the semiconductor memory device according to the present invention, in which two gate electrodes $G_1$ and $\overline{G}_1$ of two transistors connected to a pair of bit lines (e.g. bit lines BL1 and $\overline{BL1}$) as a sense amplifier are improved in shape. In FIG. 1, the bit lines $\overline{BL0}$, BL1, $\overline{BL1}$, BL2, ... are all formed on an insulating film (not shown) formed on an element such as a transistor, for instance.

The gate electrode $\overline{G}_1$ connected to the bit line $\overline{BL1}$ at a contact portion 11 is composed of a first straight portion 12 extending under and along the bit line $\overline{BL1}$, a second straight portion 13 extending from the contact portion 11 at a right angle with respect to the bit line $\overline{BL1}$ to under the adjacent bit line $\overline{BL0}$ passing through under the bit line BL1, and a third straight portion 14 extending under and along the adjacent bit line $\overline{BL0}$.

Further, the gate electrode $G_1$ connected to the bit line BL1 at a contact portion 21 is composed of a first straight portion 22 extending from the contact portion 21 at a right angle with respect to the bit line BL1 to under the adjacent bit line BL2 passing through under the bit line $\overline{BL1}$, and a second straight portion 23 extending under and along the bit line BL2.

In general, since the gate electrodes are formed of polysilicon and the bit lines are formed of aluminium and further these electrodes and bit lines have a specific resistivity, respectively, there exists a capacitance between each electrode and each bit line, respectively. For instance, in FIG. 1, a parasitic capacitance $C_A$ is formed between the gate electrode $G_1$ and the bit line $\overline{BL1}$ and a parasitic capacitance $C_B$ is formed between the gate electrode $\overline{G}_1$ and the bit line $\overline{BL0}$ with respect to the gate electrode $\overline{G}_1$. Further, a parasitic capacitance $C_c$ is formed between the gate electrode $G_1$ and the bit line BL2 with respect to the gate electrode $G_1$. In other words, two bit lines are to be coupled to each other via these capacitances. Therefore, it is possible to prevent erroneous operation of the sense amplifier by selectively determining these parasitic capacitances of the gate electrode $G_1$ so that the capacitance $C_A$ is equal to or smaller than $C_B$ ($C_A \leq C_B$). Using this condition, when the potential of the bit line $\overline{BL0}$ fluctuates due to noise, the potential of the bit line BL1 fluctuates to the same direction as that of the bit line $\overline{BL0}$ due to coupling with the bit line $\overline{BL0}$. At that time, since the bit line $\overline{BL1}$ is positively coupled with the bit line $\overline{BL0}$ through the gate electrode G1, the potential of $\overline{BL1}$ fluctuates to the same direction as that of the bit line $\overline{BL0}$. Accordingly, bit lines $\overline{BL1}$ and BL1 fluctuate to the same direction. Furthermore, if the parasitic capacities $C_A$ and $C_B$ are made $C_A \leq C_B$, the fluctuation amount of the two bit lines will be approximately similar value.

As a result, the potential difference between the bit lines BL1 and $\overline{BL1}$ is balanced with the interference noises of those lines, and therefore the interference noise is decreased, which can prevent erroneous operation.

In the same way, when the potential of the bit line BL2 fluctuates due to noise, it is possible to prevent erroneous operation of the sense amplifier in dependence upon the potential fluctuations of the bit line BL1, owing to the presence of the gate electrode $G_1$.

In the above mentioned shown in FIG. 1, two gate electrodes of two different shapes have been adopted to the bit lines BL1 and BL1. Without being limited thereto, however, it is also possible to adopt the same shape to these two gate electrodes. Further, the U-shaped gate electrode $G_1$ of a transistor as shown in FIG. 1 can prevent the transistor characteristics from being unbalanced by positioned mismatching of an ion injection angle difference.

Further, the capacitances $C_A$, $C_B$ and $C_C$ can be placed adjacent each other by changing the length, width and material of the gate electrode or the thickness of the insulating oxide film formed between the bit line and the gate electrode. Therefore, it is possible to obtain any given capacitance by appropriately adjusting these factors.

Figure 4:
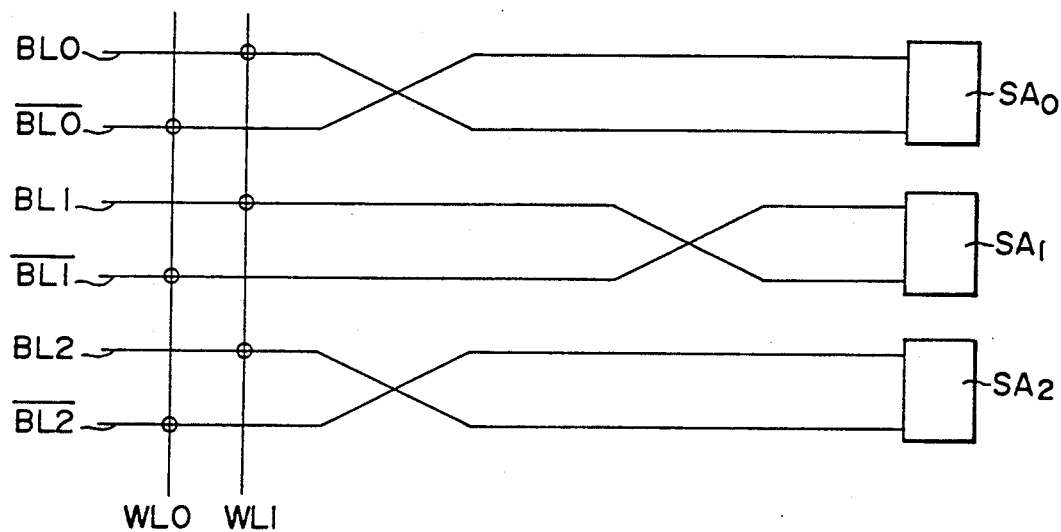
FIG. 4 is a prior-art bit line arrangement for assistance in explaining the method of canceling interference noise between two bit lines.

In the semiconductor memory device according to the present invention, the chip layout area can be reduced as compared with the prior-art device shown in FIG. 4, in which two bit lines are crossed with each other, respectively.

Further, it is possible to more effectively reduce the harmful influence upon the device due to the interference noise by determining the capacitors between two bit lines as $C_3 \simeq C_1$ and $C_4 \simeq C_2$, where $C_1$ denotes the capacitance between the two bit lines $\overline{BL0}$ and BL1; $C_2$ denotes that between $\overline{BL1}$ and BL2; $C_3$ denotes that between $\overline{BL1}$ and $\overline{BL0}$; and $C_4$ denotes that between BL1 and BL2.

Further, it is also possible to reduce the influence of any interference noise by increasing the overlap area of the transistor gate electrode and the adjacent bit line BL0 or BL2 be as broad as possible.

What is claimed is:

1. A semiconductor memory device having a plurality of pairs of parallel-arranged bit lines and a plurality of sense amplifiers for detecting a potential change of each bit line, respectively, wherein a gate electrode ($\overline{G1}$) of a transistor constituting the sense amplifier to sense a potential of a first side ($\overline{BL1}$) of a first pair of bit lines (BL1) and ($\overline{BL1}$) is formed with an extension portion (14) extending under and along a corresponding first side ($\overline{BL0}$) of a second pair of bit lines arranged adjacent to the first pair of bit lines; and a capacitance $C_B$ formed between the extension portion (14) of the gate electrode ($\overline{G1}$) and the corresponding first side ($\overline{BL0}$) of the second pair of bit lines is determined to be equal or larger than a capacitance $C_A$ formed between the first side ($\overline{BL1}$) of the first pair of bit lines and the gate electrode (G1).

2. The semiconductor memory device of claim 1, wherein the gate electrode ($\overline{G1}$) of the transistor is further formed with an additional extension portion (12) formed under and along the first side ($\overline{BL1}$) of the first pair of bit lines.

3. The semiconductor memory device of claim 1, wherein a first capacitance $C_1$ formed between the first side ($\overline{BL0}$) of the second pair of bit lines and a second side (BL1) of the first pair of bit lines is roughly equal to a second capacitance $C_3$ formed between the first side ($\overline{BL0}$) of the second pair of bit lines and the first side ($\overline{BL1}$) of the first pair of bit lines.

4. The semiconductor memory device of claim 1, wherein the second pair of bit lines and a third pair of bit lines are arranged adjacent to and on both sides of the first pair of bit lines; another gate electrode (G1) of another transistor for sensing a potential of a second side (BL1) of the first pair of bit lines (BL1 and ($\overline{BL1}$)) is formed with an extension portion (23) extending under and along a second side (BL2) of the third pair of bit lines; a first capacitance $C_1$ formed between the first side ($\overline{BL0}$) of the second pair of bit lines and a second side (BL1) of the first pair of bit lines is roughly equal to a second capacitance $C_3$ formed between the first side ($\overline{BL0}$) of the third pair of bit lines and the first side ($\overline{BL1}$) of the first pair of bit lines; and a second capacitance $C_2$ formed between the first side ($\overline{BL1}$) of the first pair of bit lines and the second side (BL2) of the third pair of bit lines is roughly equal to a fourth capacitance $C_4$ formed between the second side (BL1) of the first pair of bit lines and the second side (BL2) of the third pair of bit lines.

* * * * *